United States Patent
Ma et al.

(10) Patent No.: US 12,069,898 B2
(45) Date of Patent: Aug. 20, 2024

(54) DISPLAY PANEL, MANUFACTURING METHOD THEREOF AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qun Ma, Beijing (CN); Yue Wei, Beijing (CN); Mingxi Pan, Beijing (CN); Haoming Lv, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 590 days.

(21) Appl. No.: 17/287,900

(22) PCT Filed: Sep. 22, 2020

(86) PCT No.: PCT/CN2020/116768
§ 371 (c)(1),
(2) Date: Apr. 22, 2021

(87) PCT Pub. No.: WO2021/109682
PCT Pub. Date: Jun. 10, 2021

(65) Prior Publication Data
US 2022/0310721 A1    Sep. 29, 2022

(30) Foreign Application Priority Data

Dec. 2, 2019   (CN) .......................... 201911213367.0

(51) Int. Cl.
*H10K 59/122*   (2023.01)
*H10K 50/842*   (2023.01)
(Continued)

(52) U.S. Cl.
CPC ....... *H10K 59/122* (2023.02); *H10K 50/8428* (2023.02); *H10K 71/00* (2023.02); *H10K 59/1201* (2023.02)

(58) Field of Classification Search
CPC ............. H10K 59/122; H10K 50/8428; H10K 59/8723; H10K 27/1288; G02F 1/13394
See application file for complete search history.

(56) References Cited

U.S. PATENT DOCUMENTS

2009/0140438 A1*   6/2009   Yamazaki   ......... H01L 29/78696
                                                             257/784
2012/0305922 A1    12/2012   Yamazaki
(Continued)

FOREIGN PATENT DOCUMENTS

CN   103794634 A   5/2014
CN   104538357 A   4/2015
(Continued)

OTHER PUBLICATIONS

China National Intellectual Property Administration (ISA/CN), International Search Report and Written Opinion for International Application No. PCT/CN2020/116768, dated Dec. 4, 2020.
(Continued)

*Primary Examiner* — Alia Sabur
(74) *Attorney, Agent, or Firm* — Brooks Kushman P.C.

(57) ABSTRACT

The present disclosure provides a display panel, a manufacturing method thereof and a display device. The display panel includes a base substrate, a TFT array, a pixel definition layer, and a plurality of light-emitting units. The display panel further includes a plurality of spacers arranged on a surface of the pixel definition layer away from the base substrate, the plurality of spacers is formed integrally with the pixel definition layer, a surface of each spacer away from the base substrate includes a first portion and a second portion, a distance between the second portion and the base
(Continued)

substrate is smaller than a distance between the first portion and the base substrate, and a ratio of a sum of areas of the first portions of the plurality of spacers to an area of a display region of the display panel is not smaller than a preset threshold.

20 Claims, 3 Drawing Sheets

(51) Int. Cl.
 *H10K 59/12* (2023.01)
 *H10K 71/00* (2023.01)

(56) References Cited

U.S. PATENT DOCUMENTS

| | | | | |
|---|---|---|---|---|
| 2015/0207094 | A1* | 7/2015 | Hwang | H10K 50/8428 |
| | | | | 257/88 |
| 2016/0254476 | A1* | 9/2016 | Park | H10K 50/813 |
| | | | | 257/40 |
| 2016/0372531 | A1 | 12/2016 | Shen | |
| 2018/0226508 | A1* | 8/2018 | Chen | H01L 27/1225 |
| 2019/0027543 | A1 | 1/2019 | Zhang et al. | |
| 2019/0044090 | A1 | 2/2019 | Song | |
| 2019/0393283 | A1* | 12/2019 | Lu | H10K 59/65 |

FOREIGN PATENT DOCUMENTS

| | | | | |
|---|---|---|---|---|
| CN | 106033800 | A | | 10/2016 |
| CN | 107331791 | A | | 11/2017 |
| CN | 107369779 | A | | 11/2017 |
| CN | 108364976 | A | | 8/2018 |
| CN | 109148379 | A * | 1/2019 | H01L 23/564 |
| CN | 109148379 | A | | 1/2019 |
| CN | 110993661 | A | | 4/2020 |
| KR | 20160104804 | A | | 9/2016 |

OTHER PUBLICATIONS

First Office Action for Chinese Application No. 201911213367.0, dated Nov. 3, 2021, 11 Pages.

\* cited by examiner

DISPLAY PANEL, MANUFACTURING METHOD THEREOF AND DISPLAY DEVICE

CROSS-REFERENCE TO RELATED APPLICATIONS

This application is the U.S. national phase of PCT Application No. PCT/CN2020/116768 filed on Sep. 22, 2020, which claims priority to Chinese Patent Application No. 201911213367.0 filed on Dec. 2, 2019, which are incorporated herein by reference in their entireties.

TECHNICAL FIELD

The present disclosure relates to the field of display technology, in particular to a display panel, a manufacturing method thereof and a display device.

BACKGROUND

Currently, an Organic Light Emitting Diode (OLED) display device is highly competitive and promising due to such advantages as self-luminescence, rapid response, high brightness, full viewing angle, flexible display, etc.

In the related art, during the manufacture of an OLED display substrate, a spacer and a pixel definition layer are formed through a single patterning process so as to reduce the manufacture cost. However, at this time, a height-width ratio of the spacer may be remarkably reduced and an area of an end of the spacer away from a base substrate may increase. In this way, during the evaporation of a light-emitting material, the spacer may easily be scratched by an evaporation mask, and encapsulation reliability may be adversely affected by resultant debris, thereby black spots may occur and a yield of the OLED display substrate may be adversely affected.

SUMMARY

An object of the present disclosure to provide a display panel, a manufacturing method thereof and a display device, so as to improve the yield of the display panel.

In order to solve the above problem, the present disclosure provides the following technical solutions.

In one aspect, the present disclosure provides in some embodiments a display panel, including a base substrate, a thin film transistor (TFT) array arranged on the base substrate, a pixel definition layer arranged at a side of the TFT array away from the base substrate, and a plurality of light-emitting units arranged at a pixel region defined by the pixel definition layer. The display panel further includes a plurality of spacers arranged on a surface of the pixel definition layer away from the base substrate, a surface of at least one spacer away from the base substrate includes a first portion and a second portion, a distance between the second portion and the base substrate is smaller than a distance between the first portion and the base substrate, and a ratio of a sum of areas of the first portions of the plurality of spacers to an area of a display region of the display panel is not smaller than a preset threshold.

In a possible embodiment of the present disclosure, the plurality of spacers is formed integrally with the pixel definition layer.

In a possible embodiment of the present disclosure, the second portion forms a groove.

In a possible embodiment of the present disclosure, a ratio of an area of the second portion to an area of the first portion is about 0.5 to 1.

In a possible embodiment of the present disclosure, a slope angle of the pixel definition layer is not larger than 30°, and a slope angle of each spacer is not smaller than 40°.

In a possible embodiment of the present disclosure, a ratio of a height of each spacer to a height of the pixel definition layer is about 2 to 2.5, the height of each spacer is a maximum distance between the surface of the spacer away from the base substrate and the base substrate, and the height of the pixel definition layer is a maximum distance between the surface of the pixel definition layer away from the base substrate and the base substrate.

In a possible embodiment of the present disclosure, the plurality of spacers is uniformly distributed on the base substrate.

In another aspect, the present disclosure provides in some embodiments a display device including the above-mentioned display panel.

In yet another aspect, the present disclosure provides in some embodiments a method for manufacturing a display panel, including: forming a TFT array on a base substrate; forming a pixel definition layer and a plurality of spacers on the pixel definition layer through a single patterning process, a surface of each spacer away from the base substrate including a first portion and a second portion, a distance between the second portion and the base substrate being smaller than a distance between the first portion and the base substrate, and a ratio of a sum of areas of the first portions of the plurality of spacers to an area of a display region of the display panel is not smaller than a preset threshold; and forming a plurality of light-emitting units at a pixel region defined by the pixel definition layer.

In a possible embodiment of the present disclosure, a ratio of an area of the second portion to an area of the first portion is about 0.5 to 1.

In a possible embodiment of the present disclosure, the pixel definition layer includes a portion covered by the spacers and a portion not covered by the spacers, and the forming the pixel definition layer and the plurality of spacers on the pixel definition layer through a single patterning process includes: forming a layer of photoresist for forming the pixel definition layer and the plurality of spacers on the base substrate; exposing the photoresist through a mask, the mask including a first pattern corresponding to the portion not covered by the spacers and a second pattern corresponding to the portion covered by the spacers, the first pattern surrounding the second pattern, the first pattern including an opaque pattern and a third partially-transparent pattern, the second pattern including a first partially-transparent pattern and a second partially-transparent pattern surrounding the first partially-transparent pattern, a light transmittance of the second partially-transparent pattern being greater than a light transmittance of the first partially-transparent pattern, and the light transmittance of the second partially-transparent pattern being greater than a light transmittance of the third partially-transparent pattern; and performing a development process to form the pixel definition layer and the plurality of spacers.

In a possible embodiment of the present disclosure, the light transmittance of the first partially-transparent pattern gradually decreases in a direction away from the second partially-transparent pattern.

In a possible embodiment of the present disclosure, a light transmittance of the first pattern is about 20% to 25%, and a difference between the light transmittance of the second partially-transparent pattern and the light transmittance of the first pattern is greater than 5%.

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, during the manufacture of an OLED display substrate, for cost reasons, a plurality of spacers and a pixel definition layer are formed through a single patterning process.

Figure 1:
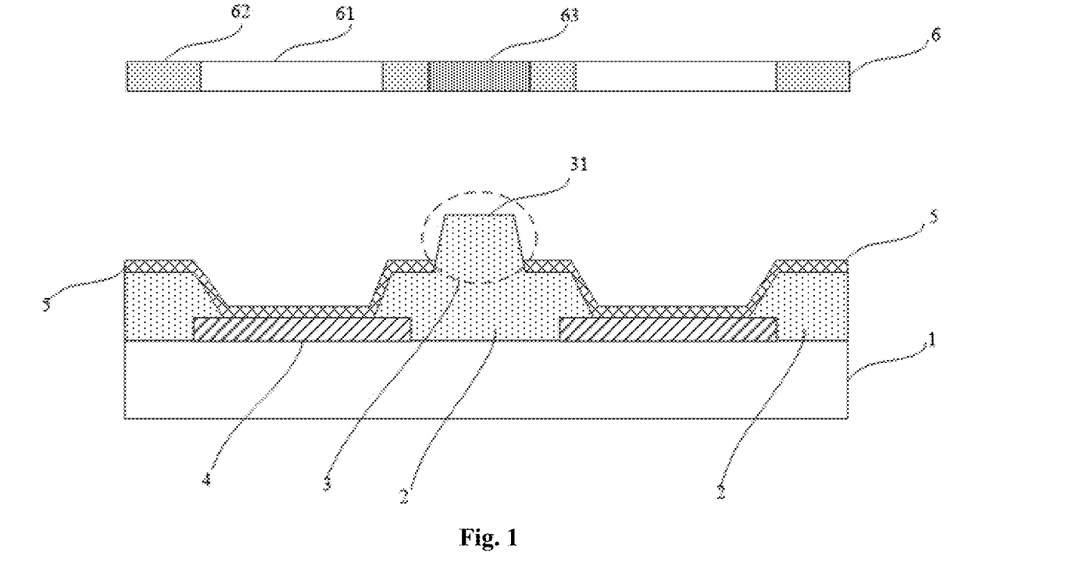
FIG. 1 is a schematic view showing the manufacture of an OLED display substrate in the related art.

As shown in FIG. 1, during the manufacture of the plurality of spacers and the pixel definition layer, a layer of photoresist for forming the pixel definition layer and the plurality of spacers is formed on a substrate. The photoresist may be negative or positive.

Taking a negative photoresist as an example, it is exposed through a mask 6. The mask plate 6 includes an opaque pattern 61, a third partially-transparent pattern 62 and a second partially-transparent pattern 63. A light transmittance of the third partially-transparent pattern is smaller than a light transmittance of the second partially-transparent pattern 63 and greater than a light transmittance of the opaque pattern 61. The opaque pattern 61 and the third partially-transparent pattern 62 are configured to form a portion of the pixel definition layer not covered by the spacers. The second partially-transparent pattern 63 is configured to form a portion of the pixel definition layer covered by the spacers.

After a developing process, a photoresist unreserved region is formed at a position corresponding to the opaque pattern 61, a photoresist material fully-reserved region is formed at a position corresponding to the second partially-transparent pattern 63 with a largest light transmittance, and a photoresist partially-reserved region is formed at a position corresponding to the third partially-transparent pattern 62 photoresist.

The portion of the pixel definition layer 2 not covered by the spacer 3 is formed at the photoresist partially-reserved region, and the portion of the pixel definition layer 2 covered by the spacer 3 and the spacer 3 on the pixel definition layer 2 are formed at the photoresist fully-reserved region. However, an area of a surface of the spacer 3 away from the substrate 1 is large. When a light-emitting material is evaporated subsequently, the spacer 3 is easily scratched by the mask, and the encapsulation reliability of the OLED display substrate may be adversely affected by resultant debris, thereby black spots may occur and a yield of the OLED display substrate may be adversely affected.

An object of the present disclosure is to provide a display panel, a manufacturing method thereof and a display device, so as to improve the yield of the display panel.

The present disclosure provides in some embodiments a display panel, which includes a base substrate, a TFT array arranged on the base substrate, a pixel definition layer arranged at a side of the TFT array away from the base substrate, and a plurality of light-emitting units arranged at a pixel region defined by the pixel definition layer. The display panel further includes a plurality of spacers arranged on a surface of the pixel definition layer away from the base substrate, a surface of at least one spacer away from the base substrate includes a first portion and a second portion, a distance between the second portion and the base substrate is smaller than a distance between the first portion and the base substrate, and a ratio of a sum of areas of the first portions of the plurality of spacers to an area of a display region of the display panel is not smaller than a preset threshold.

For cost reasons, in a possible embodiment of the present disclosure, the plurality of spacers may be formed integrally with the pixel definition layer. It should be appreciated that, the plurality of spacers and the pixel definition layer may also be formed through a plurality of pattern processes, that is, the plurality of spacers may not be formed integrally with the pixel definition layer.

In the embodiments of the present disclosure, the surface of each spacer away from the base substrate may include the first portion and the second portion, and the distance between the second portion and the base substrate may be smaller than the distance between the first portion and the base substrate. In this way, a support surface of each spacer, i.e., the first portion or a surface of each spacer that may probably be scratched by a mask during the evaporation of light-emitting material, may have a relatively small area. During the evaporation of the light-emitting material, it is able to reduce a probability of scratching, by the mask, each spacer, and prevent the encapsulation reliability from being adversely affected by debris from the spacer, thereby to improve the yield of the display panel.

Figure 4:
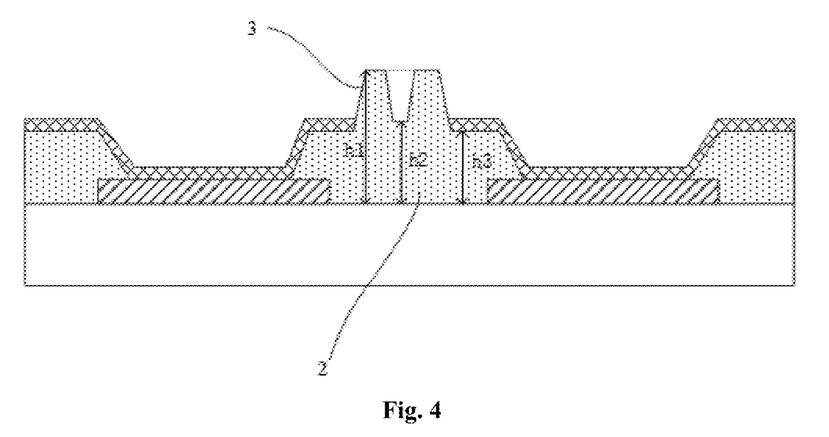
FIG. 4 is a schematic view showing heights of a first portion and a second portion of the spacer and the pixel definition layer according to one embodiment of the present disclosure.

FIG. 4 shows heights of the first portion and the second portion of the spacer and the pixel definition layer. As shown in FIG. 4, the first portion may be provided with a flat surface, so as to support an encapsulation layer. The second portion may be uneven or form a groove, as long as a distance h2 between the second portion and the base substrate is smaller than a distance h1 between the first portion and the base substrate. Since the distance h2 between the second portion and the base substrate is smaller than the distance h1 between the first portion and the base substrate, the second portion may not be in contact with the mask during the evaporation of the light-emitting material.

In the embodiments of the present disclosure, the ratio of the sum of the areas of the first portions and the area of the display region of the display panel may not be smaller than the preset threshold, so as to provide a sufficient support force through the spacers. In this way, it is able to reduce the probability of scratching, by the mask, the spacer without any influence on the support force from the spacer, and prevent the encapsulation reliability from being adversely affected by the resultant debris from the spacer, thereby to improve the yield of the display panel.

In the related art, usually a surface of each spacer away from the base substrate has a size of 10 μm*10 μm. During the evaporation of the light-emitting material, an area of the surface of the spacer in contact with the mask may be 100 square microns, so the spacer is easily scratched by the mask, and the encapsulation reliability may be adversely affected by the resultant debris from the spacer.

In the embodiments of the present disclosure, the surface of each spacer away from the base substrate may be divided into the first portion and the second portion, a ratio of an area of the second portion to an area of the first portion may be 0.5 to 1. In this way, it is able to reduce an area of the surface of the spacer in contact with the mask, thereby to reduce the probability of scratching, by the mask, the spacer. Of course, the ratio of the area of the second portion to the area of the first portion may be not limited to 0.5 to 1, and any other value may also be selected. However, when the ratio of the area of the second portion to the area of the first portion is 0.5 to 1, it is able to not only provide a sufficient support force through the spacer but also reduce the probability of scratching, by the mask, the spacer.

Figure 2:
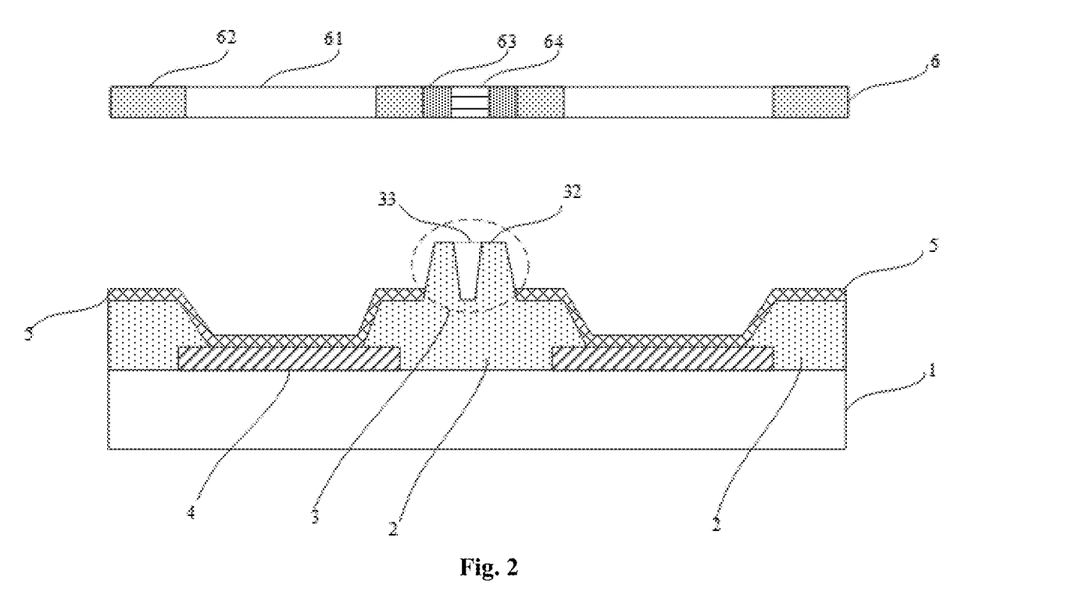
FIG. 2 is a schematic view showing the manufacture of a display panel according to one embodiment of the present disclosure.

To be specific, the second portion may form a groove. In a specific embodiment of the present disclosure, as shown in FIG. 2, the display panel includes a substrate 1, a pixel definition layer 2 arranged on the substrate, a plurality of spacers 3 on the pixel definition layer 3, and a light-emitting material and an anode 4 arranged at a pixel region defined by the pixel definition layer 2. The substrate 1 includes a base substrate and a driving circuit layer on the base substrate. As shown in FIG. 2, a groove 33 is formed in a surface of each spacer 3 away from the substrate 1. In this way, an area of a support surface 32 of the spacer 3 away from the substrate 1, i.e., an area of the first portion may be reduced in the case that a height and a slope angle of the spacer 3 remain unchanged. During the evaporation of the light-emitting material, it is able to reduce the probability of scratching, by the mask, the spacer and prevent the encapsulation reliability from being adversely affected by the debris from the spacer, thereby to improve the yield of the display panel.

A size of the groove 33 may be set according to the practical needs. To be specific, a ratio of an area of the groove 33 to an area of the support surface 32 may be 0.5 to 1, so as to provide a sufficient support force through the spacer 3, and reduce the probability of scratching, by the mask, the spacer 3.

Figure 3:
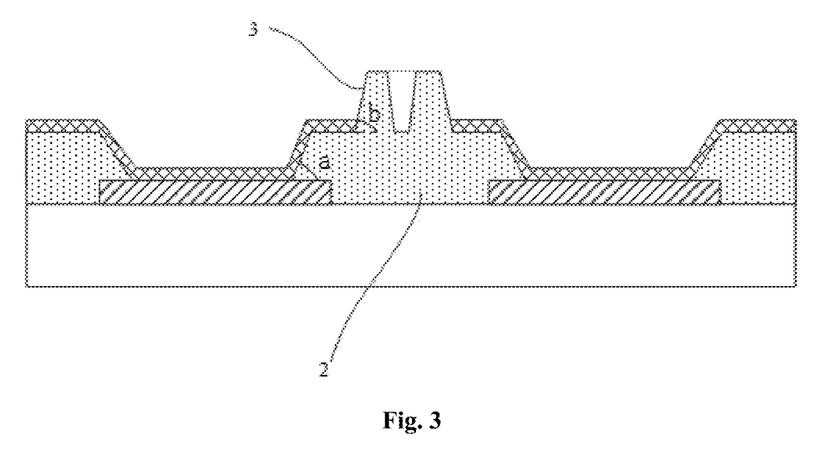
FIG. 3 is a schematic view showing slope angles of a spacer and a pixel definition layer according to one embodiment of the present disclosure.

FIG. 3 shows slope angles of the spacer and the pixel definition layer. As shown in FIG. 3, a slope angle of the pixel definition layer needs to be relatively small, so as to prevent the light-emitting material from being broken on the pixel definition layer during the subsequent evaporation of the light-emitting material. To be specific, the slope angle a of the pixel definition layer may be not greater than 30°. A slope angle b of each spacer should be relatively large, so as to reduce a ratio of the area of the surface of the spacer away from the base substrate to the height of the spacer. To be specific, the slope angle b of each spacer may be not smaller than 40°.

In the embodiments of the present disclosure, a ratio of the height of each spacer to the height of the pixel definition layer may be 2 to 2.5. The height of each spacer may be a maximum distance between the surface of the spacer away from the base substrate and the base substrate, and the height of the pixel definition may be a maximum distance between the surface of the pixel definition layer away from the base substrate and the base substrate.

When the ratio of the height of each spacer to the height of the pixel definition layer is too large, the encapsulation reliability of the display panel may be adversely affected. When the ratio of the height of each spacer to the height of the pixel definition layer is too small, the probability of the mask in contact with the pixel definition layer may increase during the evaporation of the light-emitting material. When the ratio of the height of each spacer to the height of the pixel definition layer is 2 to 2.5, it is able to ensure the encapsulation reliability of the display panel, and prevent the mask from being in contact with the pixel definition layer during the evaporation of the light-emitting material.

In the embodiments of the present disclosure, the plurality of spacers may be uniformly distributed on the base substrate so as to provide a uniform support force.

Since the area of the support surface 32 of each spacer 3 away from the substrate 1, i.e., the area of the first portion, is reduced, in order to provide a sufficient support force through the spacers 3, a density of the spacers may be increased, so that the ratio of the sum of the areas of the first portions of the plurality of spacers to the display region of the display panel is not smaller than the preset threshold. In this way, it is still able to provide a sufficient support force through the spacer 3 even in the case that the area of the support surface 32 of the spacer 3 away from the substrate 1 is reduced.

In the related art, M spacers as shown in FIG. 1 may be arranged in each display panel. In the embodiments of the present disclosure, in order to provide a sufficient support force through the spacers, 1.5M to 2M spacers may be arranged in the display panel with a same size as shown in FIG. 2, where M is a positive integer.

In a possible embodiment of the present disclosure, the ratio of the sum of the areas of the first portions of the spacers to an area of the entire display region of the display panel may be about 0.5% to 2.5%, e.g., 1.5%, so as to provide a sufficient support force through the spacers. In this regard, it is able to reduce the probability of scratching, by the mask, the spacer without any influence on the support force from the spacer, and prevent the encapsulation reliability from being adversely affected by the debris from the spacer, thereby to improve the yield of the display panel.

Figure 5:
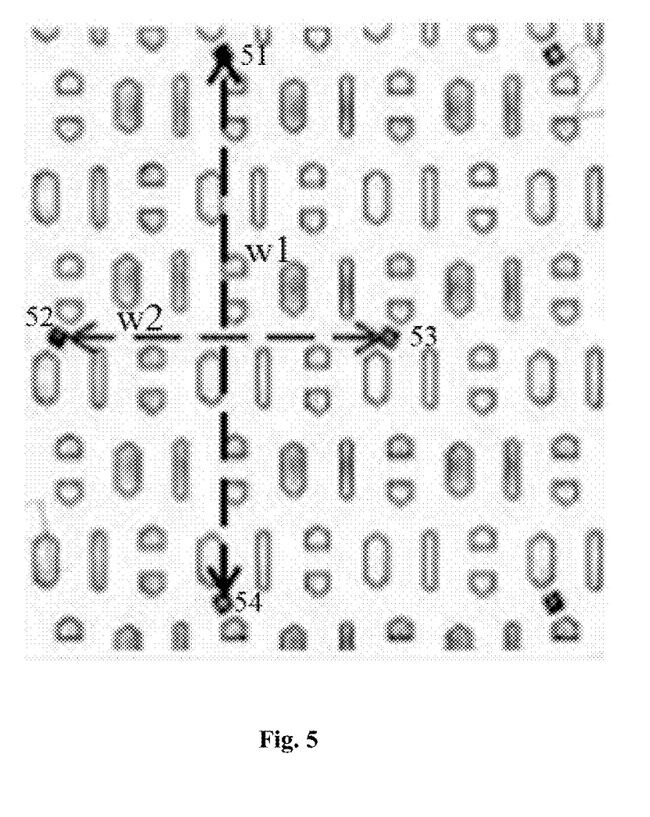
FIG. 5 is a schematic view showing the spacers and a display region of the display panel according to one embodiment of the present disclosure.

As shown in FIG. 5, which shows the plurality of spacers and the display region of the display panel, a part of the display region of the entire display panel may be selected to estimate the ratio of the sum of the areas of the first portions of the spacers to the area of the entire display region of the display panel. In the region as shown in FIG. 5, a first spacer 51, a second spacer 52, a third spacer 53 and a fourth spacer 54 are located at four vertices. A sum of areas of first portions of the first spacer 51, the second spacer 52, the third spacer 53 and the fourth spacer 54 is S0, a distance between the first spacer 51 and the fourth spacer is w1, a distance between the second spacer 51 and the third spacer is w2, and an area of the region is $S1=w1*w2$. The ratio p of the sum of the areas of the first portions of the spacers to the area of the entire display region of the display panel may be estimated as $p=S0/(0.5*S1)$.

Further, the ratio of the sum of the areas of the first portions of the spacers to area of the display region of the display panel may be not smaller than the preset threshold, and the preset threshold may be 1.5%. When the ratio of the sum of the areas of the first portions of the spacers to the display region of the display panel is too small, the support force from the spacer may be adversely affected.

The present disclosure further provides in some embodiments a display device, including the above-mentioned display panel. The display device may be any product or member having a display function, such as television, display, digital photo frame, mobile phone, or tablet computer.

The display device further includes a flexible printed circuit, a printed circuit board, and a back plate.

The present disclosure provides in some embodiments a method for manufacturing a display panel, including: forming a TFT array on a base substrate; forming a pixel definition layer and a plurality of spacers on the pixel definition layer through a single patterning process, a surface of each spacer away from the base substrate including a first portion and a second portion, a distance between the second portion and the base substrate being smaller than a distance between the first portion and the base substrate, and a ratio of a sum of areas of the first portions of the plurality of spacers to an area of a display region of the display panel is not smaller than a preset threshold; and forming a plurality of light-emitting units at a pixel region defined by the pixel definition layer.

In the embodiments of the present disclosure, the surface of each spacer away from the base substrate may include the first portion and the second portion, and the distance between the second portion and the base substrate may be smaller than the distance between the first portion and the base substrate. In this way, a support surface of each spacer, i.e., the first portion or a surface of each spacer that may probably be scratched by a mask during the evaporation of light-emitting material, may have a relatively small area. During the evaporation of the light-emitting material, it is able to reduce a probability of scratching, by the mask, each spacer, and prevent the encapsulation reliability from being adversely affected by debris from the spacer, thereby to improve the yield of the display panel.

As shown in FIG. 4, the first portion may be provided with a flat surface, so as to support an encapsulation layer. The second portion may be uneven or form a groove, as long as a distance h2 between the second portion and the base substrate is smaller than a distance h1 between the first portion and the base substrate. Since the distance h2 between the second portion and the base substrate is smaller than the distance h1 between the first portion and the base substrate, the second portion may not be in contact with the mask during the evaporation of the light-emitting material.

In the embodiments of the present disclosure, the ratio of the sum of the areas of the first portions and the area of the display region of the display panel may not be smaller than the preset threshold, so as to provide a sufficient support force through the spacers. In this way, it is able to reduce the probability of scratching, by the mask, the spacer without any influence on the support force from the spacer, and prevent the encapsulation reliability from being adversely affected by the resultant debris from the spacer, thereby to improve the yield of the display panel.

In a possible embodiment of the present disclosure, the pixel definition layer may include a portion covered by the spacers and a portion not covered by the spacers, and the forming the pixel definition layer and the plurality of spacers on the pixel definition layer through a single patterning process may include: forming a layer of photoresist for forming the pixel definition layer and the plurality of spacers on the base substrate; exposing the photoresist through a mask, the mask including a first pattern corresponding to the portion not covered by the spacers and a second pattern corresponding to the portion covered by the spacers, the first pattern surrounding the second pattern, the first pattern including an opaque pattern and a third partially-transparent pattern, the second pattern including a first partially-transparent pattern and a second partially-transparent pattern surrounding the first partially-transparent pattern, a light transmittance of the second partially-transparent pattern being greater than a light transmittance of the first partially-transparent pattern, and the light transmittance of the second partially-transparent pattern being greater than a light transmittance of the third partially-transparent pattern; and performing a development process to form the pixel definition layer and the plurality of spacers.

As shown in FIG. 2, the mask 6 includes the first pattern for forming the portion and the second pattern for forming each spacer. The first pattern may surround the second pattern. The first pattern may include an opaque pattern 61 and a third partially-transparent pattern 63. The second pattern may include a first partially-transparent pattern 64 and a second partially-transparent pattern 63 surrounding the first partially-transparent pattern 64. A light transmittance of the second partially-transparent pattern 63 may be greater than a light transmittance of the first partially-transparent pattern 64.

Further, in the embodiments of the present disclosure, the mask 6 may further include an opaque pattern 61. The third partially-transparent pattern 62 may be a partially-transparent pattern. A light transmittance of the third partially-transparent pattern 62 may be greater than a light transmittance of the opaque pattern 61 and smaller than a light transmittance of the second partially-transparent pattern 63. The first pattern is configured to form the portion of the pixel definition layer not covered by the spacer, the second partially-transparent pattern 63 is configured to form the first portion of each spacer, and the first partially-transparent pattern 64 is configured to form a groove in a surface of each spacer.

During the manufacture of the plurality of spacers and the pixel definition layer, a layer of photoresist for forming the pixel definition layer and the plurality of spacers may be formed on the substrate. The photoresist may be negative or positive. Taking a negative photoresist as an example, it may be exposed through the mask 6 in FIG. 2.

After the developing process, the portion of the pixel definition layer 2 not covered by the spacer 3 may be formed at a photoresist reserved region corresponding to the third partially-transparent pattern 62, the groove 33 in the surface of each spacer 3 may be formed at a photoresist reserved region corresponding to the first partially-transparent pattern 64, the portion of the pixel definition layer 2 covered by each spacer 2 and the spacer 3 on the pixel definition layer 2 may be formed at a photoresist reserved region corresponding to the second partially-transparent pattern 63, and a photoresist unreserved region may correspond to the opaque pattern 61, i.e., a region between two portions of the pixel definition layer 2. Since the groove 33 is formed in the surface of the spacer 3, the support surface 32 of each spacer 3 away from the substrate may have a relatively small area. In this way, during the subsequent evaporation of the light-emitting material, it is able to reduce the probability of scratching, by the mask, the spacer 3, thereby to improve the yield of the display panel.

A light transmittance of the first partially-transparent pattern 64 may be the same at any position or may gradually decrease in a direction away from the second partially-transparent pattern 63. In this regard, the groove with a V-shaped cross section may be formed, as long as the light transmittance of first partially-transparent pattern 64 is smaller than the light transmittance of the second part of the partially-transparent pattern 63.

In a specific embodiment of the present disclosure, the light transmittance of the third partially-transparent pattern 62 may be 20% to 25%, and a difference between the light transmittance of the second partially-transparent pattern 63 and the light transmittance of the third partially-transparent pattern 62 may be greater than 5%. A slope angle of each spacer 3 may depend on the difference between the light transmittance of the second partially-transparent pattern 63 and the light transmittance of the third partially-transparent pattern 62. The greater the difference between the light transmittance of the second partially-transparent pattern 63 and the light transmittance of the third partially-transparent pattern 62, the greater the slope angle of each spacer 3. When the difference between the light transmittance of the second partially-transparent pattern 63 and the light transmittance of the third partially-transparent pattern 62 is greater than 5%, it is able to increase the slope angle of each spacer 3, thereby to further reduce the ratio of the area of the surface of the spacer 3 away from the base substrate to the height of the spacer 3.

According to the method for manufacturing the display panel in the embodiments of the present disclosure, it is merely necessary to change the mask, rather than a manufacture procedure and a manufacture process for the display panel, so as to reduce the area of the surface of the spacer away from the base substrate without any change in the height of the spacer, thereby to reduce the probability of scratching, by the mask, the spacer.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a base substrate, a thin film transistor (TFT) array arranged on the base substrate, a pixel definition layer arranged at a side of the TFT array away from the base substrate, and a plurality of light-emitting units arranged at a pixel region defined by the pixel definition layer, wherein the display panel further comprises a plurality of spacers arranged on a surface of the pixel definition layer away from the base substrate, a surface of at least one spacer away from the base substrate comprises a first portion and a second portion, a distance between the second portion and the base substrate is smaller than a distance between the first portion and the base substrate; wherein a slope angle of the pixel definition layer is not larger than 30°, and a slope angle of each spacer is not smaller than 40°.

2. The display panel according to claim 1, wherein the plurality of spacers is formed integrally with the pixel definition layer.

3. The display panel according to claim 2, wherein the plurality of spacers is uniformly distributed on the base substrate.

4. The display panel according to claim 1, wherein the second portion forms a groove.

5. The display panel according to claim 4, wherein the plurality of spacers is uniformly distributed on the base substrate.

6. The display panel according to claim 1, wherein a ratio of an area of the second portion to an area of the first portion is about 0.5 to 1.

7. The display panel according to claim 6, wherein the plurality of spacers is uniformly distributed on the base substrate.

8. The display panel according to claim 1, wherein a ratio of a height of each spacer to a height of the pixel definition layer is about 2 to 2.5, the height of each spacer is a maximum distance between the surface of the spacer away from the base substrate and the base substrate, and the height of the pixel definition layer is a maximum distance between the surface of the pixel definition layer away from the base substrate and the base substrate.

9. The display panel according to claim 8, wherein the plurality of spacers is uniformly distributed on the base substrate.

10. The display panel according to claim 1, wherein the plurality of spacers is uniformly distributed on the base substrate.

11. The display panel according to claim 1, wherein a ratio of a sum of areas of the first portions of the plurality of spacers to an area of a display region of the display panel is not smaller than a preset threshold and the preset threshold is about 0.5% to 2.5%.

12. The display panel according to claim 11, wherein the preset threshold is about 1.5%.

13. A display device, comprising the display panel according to claim 1.

14. A method for manufacturing a display panel, comprising:
    forming a TFT array on a base substrate;
    forming a pixel definition layer and a plurality of spacers on the pixel definition layer through a single patterning process, a surface of each spacer away from the base substrate comprising a first portion and a second portion, a distance between the second portion and the base substrate being smaller than a distance between the first portion and the base substrate; and
    forming a plurality of light-emitting units at a pixel region defined by the pixel definition layer;
    wherein a slope angle of the pixel definition layer is not larger than 30°, and a slope angle of each spacer is not smaller than 40°.

15. The method according to claim 14, wherein a ratio of an area of the second portion to an area of the first portion is about 0.5 to 1.

16. The method according to claim 15, wherein the pixel definition layer comprises a portion covered by the spacers and a portion not covered by the spacers, wherein the forming the pixel definition layer and the plurality of spacers on the pixel definition layer through a single patterning process comprises:
- forming a layer of photoresist for forming the pixel definition layer and the plurality of spacers on the base substrate;
- exposing the photoresist through a mask, the mask comprising a first pattern corresponding to the portion not covered by the spacers and a second pattern corresponding to the portion covered by the spacers, the first pattern surrounding the second pattern, the first pattern comprising an opaque pattern and a third partially-transparent pattern, the second pattern comprising a first partially-transparent pattern and a second partially-transparent pattern surrounding the first partially-transparent pattern, a light transmittance of the second partially-transparent pattern being greater than a light transmittance of the first partially-transparent pattern, and the light transmittance of the second partially-transparent pattern being greater than a light transmittance of the third partially-transparent pattern; and
- performing a development process to form the pixel definition layer and the plurality of spacers.

17. The method according to claim 16, wherein the light transmittance of the first partially-transparent pattern gradually decreases in a direction away from the second partially-transparent pattern.

18. The method according to claim 16, wherein a light transmittance of the first pattern is about 20% to 25%, and a difference between the light transmittance of the second partially-transparent pattern and the light transmittance of the first pattern is greater than 5%.

19. The method according to claim 14, wherein a ratio of a sum of areas of the first portions of the plurality of spacers to an area of a display region of the display panel is not smaller than a preset threshold and the preset threshold is about 0.5% to 2.5%.

20. The method according to claim 19, wherein the preset threshold is about 1.5%.

* * * * *